(12) United States Patent
Baek

(10) Patent No.: US 8,116,155 B2
(45) Date of Patent: Feb. 14, 2012

(54) APPARATUS FOR MEASURING DATA SETUP/HOLD TIME

(75) Inventor: Chang Ki Baek, Incheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 743 days.

(21) Appl. No.: 12/290,762

(22) Filed: Nov. 3, 2008

(65) Prior Publication Data

US 2009/0323447 A1 Dec. 31, 2009

(30) Foreign Application Priority Data

Jun. 27, 2008 (KR) .................. 10-2008-0061905

(51) Int. Cl.
*G11C 7/00* (2006.01)
(52) U.S. Cl. ... 365/194; 365/193; 365/195; 365/189.05; 365/189.08
(58) Field of Classification Search .................. 365/194, 365/195, 193, 189.05, 189.08
See application file for complete search history.

(56) References Cited

U.S. PATENT DOCUMENTS

| | | | |
|---|---|---|---|
| RE35,723 E * | 2/1998 | Takasugi .................. | 365/189.05 |
| 6,097,230 A | 8/2000 | Bareither | |
| 6,339,353 B1 * | 1/2002 | Tomita et al. .................. | 327/210 |
| 6,489,819 B1 * | 12/2002 | Kono et al. .................... | 327/141 |
| 6,807,116 B2 * | 10/2004 | Yamazaki et al. ............. | 365/201 |
| 7,373,566 B2 * | 5/2008 | Mizuhashi et al. ........... | 714/724 |
| 7,795,939 B2 * | 9/2010 | Chen et al. ..................... | 327/199 |
| 2003/0028835 A1 * | 2/2003 | Ishikawa ....................... | 714/718 |

FOREIGN PATENT DOCUMENTS

| | | |
|---|---|---|
| KR | 10-2004-0055381 A | 6/2004 |
| KR | 10-2006-0008678 A | 1/2006 |

\* cited by examiner

*Primary Examiner* — Viet Q Nguyen
(74) *Attorney, Agent, or Firm* — John P. White; Cooper & Dunham LLP

(57) ABSTRACT

An apparatus for measuring data setup/hold time is capable of effectively measuring a setup/hold time of data, and includes a data generating unit for delaying an external clock signal according to counting signals and generating an internal clock signal and data signals from the delayed external clock signal in response to test signals, a data latch unit for latching buffered data signals in synchronization with the internal clock signal, wherein the buffered data signals are produced by buffering the data signals, a flag signal generating unit for generating flag signals from the latched data signals latched in the data latch unit in response to the test signals, and a counter for producing the counting signals in response to the flag signals.

23 Claims, 7 Drawing Sheets

APPARATUS FOR MEASURING DATA SETUP/HOLD TIME

TECHNICAL FIELD

The present disclosure relates to a semiconductor memory device and, more particularly, to an apparatus for effectively measuring data setup/hold time.

BACKGROUND

Recently, with the high speed operation of a microprocessor, a synchronous DRAM (SDRAM) has been used to input/output data in synchronization with an external clock signal. However, since a DRAM does not operate with enough speed in some instances for the microprocessor, synchronization operation is applied in order to improve the performance of the DRAM by reducing the speed gap between the DRAM and the microprocessor.

In the synchronous DRAM (SDRAM), the data are input and output using an internal clock signal which is produced in synchronization with an external clock signal. Since this synchronous DRAM (SDRAM) executes the data input/output operations based on the internal clock signal, it is possible to write and read out the data in high speed.

Meanwhile, in the synchronous DRAM device, it is important to secure normal setup/hold time for an internal clock signal in order to normally write and read out the data. Here, the setup time means an amount of time data input must be applied before an external clock signal is issued and the hold time means an amount of time the input data must be maintained after the external clock signal is issued. That is, the setup time means an amount of time taken prior to start of a data valid window and the hold time means an amount of time taken after the data valid window.

A conventional measurement of the data setup/hold time is executed by changing a delay section between an input data and a clock signal in external equipment and then comparing the input data with an output data from an output pad through read/write operations.

However, this conventional measurement of the setup/hold time needs the external equipment to change the delay section between the data input and the clock signal and deteriorates the efficiency because the read/write operations must be executed to compare the input data with the output data from the pad.

SUMMARY

In an aspect of the present disclosure, an apparatus for measuring a data setup/hold time is provided that is capable of producing data signals and an internal clock signal using an external clock signal in response to a test signal and is capable of measuring the setup/hold time according to the states of buffered data without read/write operations.

In an embodiment, an apparatus for measuring setup/hold time includes a data generating unit for delaying an external clock signal according to counting signals and generating an internal clock signal and data signals from the delayed external clock signal in response to test signals, a data latch unit for latching buffered data signals in synchronization with the internal clock signal, wherein the buffered data signals are produced by buffering the data signals, a flag signal generating unit for generating flag signals from the latched data signals latched in the data latch unit, in response to the test signals, and a counter for producing the counting signals in response to the flag signals.

The data generating unit can include a delay unit for delaying the external clock signal by a delay section which can be determined based on the counting signals, and a multiplexer for generating the internal clock signal and the data signals from an output signal of the delay unit and the external clock signal in response to the test signals.

The delay unit can include a plurality of delayers which are selectively enabled by the counting signals and wherein the delay section of the delay unit can be determined based on a number of the delayers which are enabled by the counting signals.

The multiplexer can include a first transfer unit for selectively transferring the external clock signal or the output signal of the delay unit as the internal clock signal in response to one or more test signals, and a second transfer unit for selectively transferring the external clock signal or the output signal of the delay unit as the data signals in response to one or more test signals.

The data latch unit can include a driving signal generating unit for generating a driving signal by latching the buffered data signals in response to a buffered signal which is produced by buffering the internal clock signal, and a driving unit for driving an output node in response to the driving signal.

The data latch unit can further include a latch circuit for latching a signal from the output node, and a reset circuit for setting up a voltage level of the output node in response to a reset signal.

The flag signal generating unit can produce the flag signals in response to the test signals, wherein the flag signals are enabled when the latched data signals in the data latch unit are at a predetermined voltage level.

The apparatus for measuring setup/hold time can further include an output unit for outputting the counting signals to a pad in response to the flag signals and the test signals.

The output unit can include a transfer unit for transferring the counting signals in response to the flag signals, and a latch unit for latching an output signal of the transfer unit in response to the test signals.

In another embodiment, an apparatus for measuring setup/hold time includes a delay unit for delaying an external clock signal by a predetermined delay section, wherein the delay unit includes a plurality of delayers which are selectively enabled in response to a plurality of counting signals, a multiplexer for generating an internal clock signal and a data signal by selectively transferring the external clock signal or an output signal of the delay unit in response to test signals, a plurality of buffers for generating a plurality of internal data signals by buffering the data signal, a data latch unit for latching the plurality of internal data signals in synchronization with the internal clock signal and then generating a plurality of sampling data signals, a flag signal generating unit for generating first and second flag signals using the plurality of sampling data signals in response to the test signals, and a counter for producing the plurality of counting signals in response to the first and second flag signals.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, the examples and embodiments of the present disclosure will be described with reference to accompanying drawings. However, the examples and embodiments are for illustrative purposes only and are not intended to limit the scope of the invention.

Figure 1:
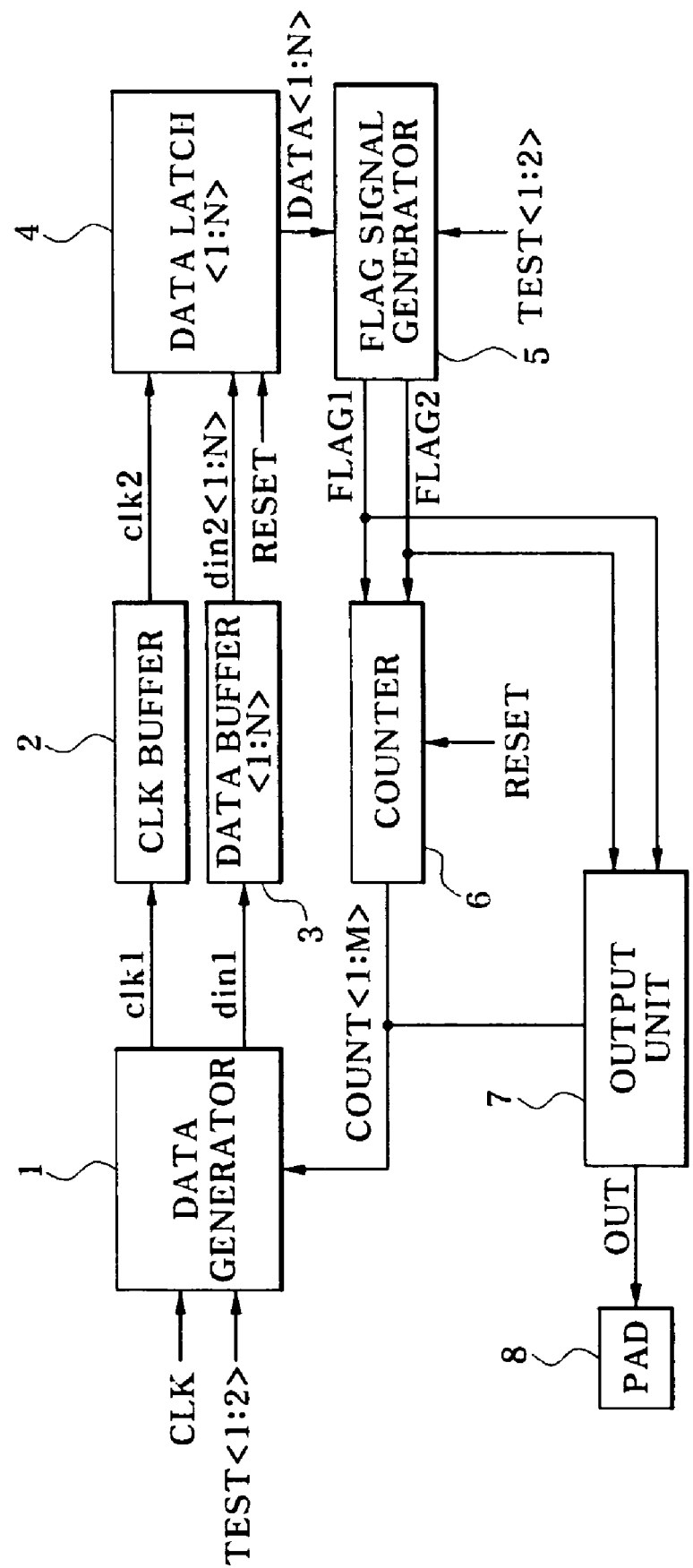
FIG. 1 is a block diagram illustrating an apparatus for measuring setup/hold time according to an embodiment of the present disclosure.

FIG. 1 is a block diagram illustrating an apparatus for measuring setup/hold time according to an embodiment of the present disclosure.

Referring to FIG. 1, the setup/hole time measuring apparatus according to an embodiment of the present disclosure includes a data generating unit 1, a clock buffer 2, a data buffer unit 3 having first to $N^{th}$ data buffers, a data latch unit 4 having first to $N^{th}$ data latch circuits, a flag signal generating unit 5, a counter 6, an output unit 7, and a pad 8.

Figure 2:
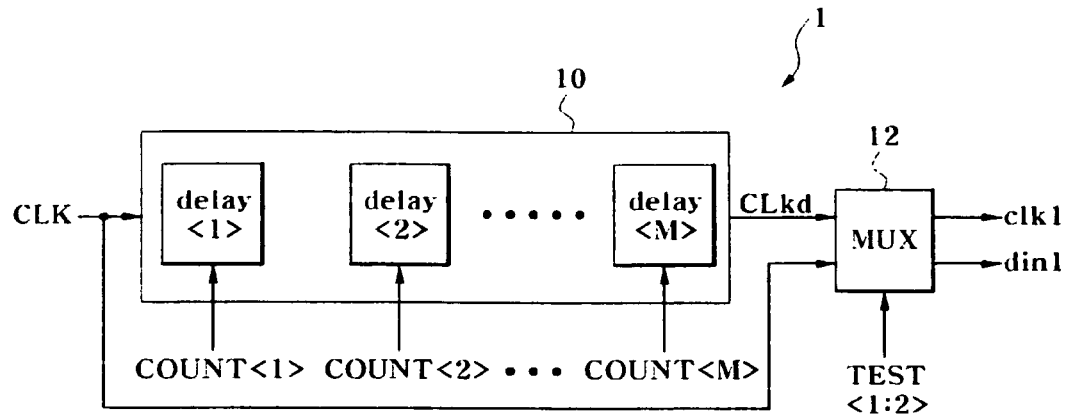
FIG. 2 is a block diagram illustrating an embodiment of a configuration of a data generating unit in the apparatus of FIG. 1.

Referring to FIG. 2, an embodiment of configuration of the data generating unit 1 includes a delay unit 10 and a multiplexer 12.

The delay unit 10 includes first to $M^{th}$ delayers delayer<1:M>, which are enabled in response to first to $M^{th}$ count signals <1:M>, respectively. The delay unit 10 produces a delayed clock signal CLKd by delaying an external clock signal CLK by a predetermined section. The delay section of the delay unit 10 can be determined based on the number of delayers (of the first to $M^{th}$ delayers delayer <1:M>) which are enabled in response to the first to $M^{th}$ count signals <1:M>. For embodiment, in a case that each of the first to $M^{th}$ delayers <1:M> has an unit delay section and K delayers of the first to $M^{th}$ delayers <1:M> are enabled in response to K count signals of the first to $M^{th}$ count signals <1:M>, the total delay section of the delay unit 10 is K times as large as the unit delay section.

Figure 3:
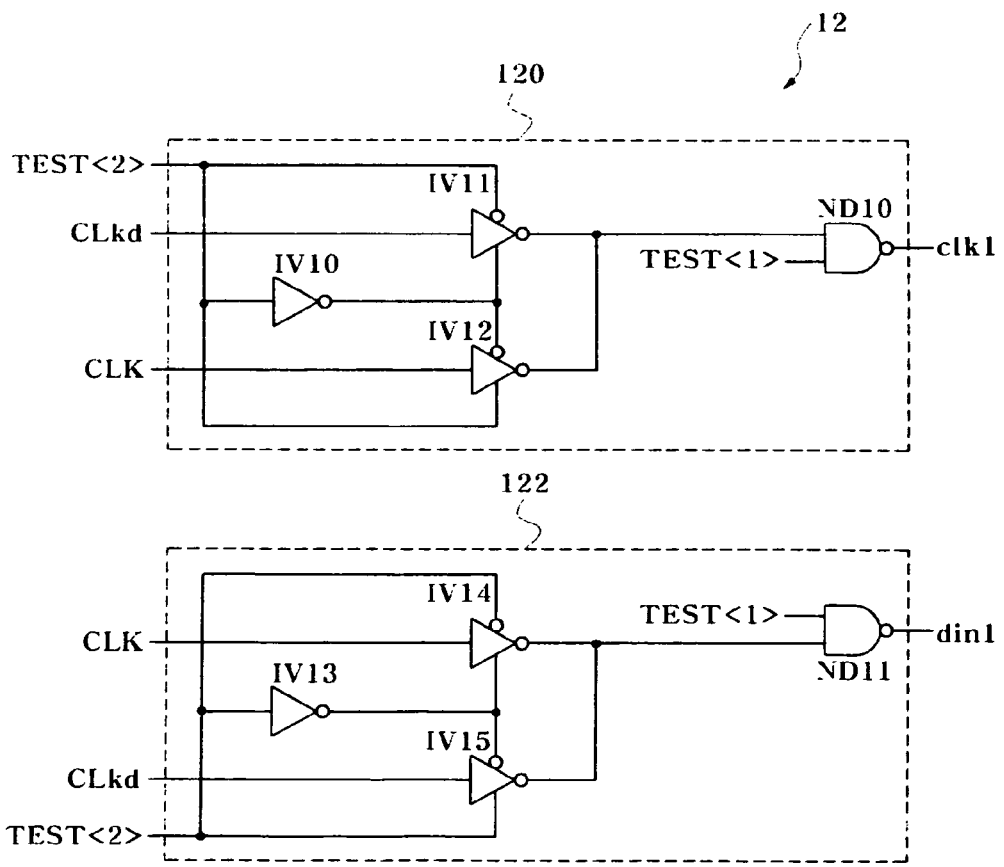
FIG. 3 is a circuit diagram illustrating an embodiment of a configuration of a multiplexer in the data generating unit of FIG. 2.

Referring to FIG. 3, an embodiment of configuration of the multiplexer 12 includes a first transfer unit 120 and a second transfer unit 122.

The first transfer unit 120 includes inverters IV11 and IV12 to selectively transfer the delayed clock signal CLKd or the external clock signal CLK in response to a second test signal TEST<2> and a NAND gate ND10 to produce a first internal clock signal clk1 by NANDing a first test signal TEST<1> and an output signal of the inverter IV11 or IV12.

The second transfer unit 122 includes inverters IV14 and IV15 to selectively transfer the external clock signal CLK or the delayed clock signal CLKd in response to the second test signal TEST<2> and a NAND gate ND11 to produce a data signal din1 by NANDing the first test signal TEST<1> and an output signal of the inverter IV14 or IV15.

The clock buffer 2 produces a second internal clock signal clk2 by buffering the first internal clock signal clk1. The clock buffer 2 may be one selected from conventional buffers to execute a buffering operation for a clock signal.

The data buffer unit 3 having the first to $N^{th}$ data buffers receives the data signal din1 and then produces the first to $N^{th}$ internal data signals din2<1:N>. The data buffer unit 3 may be one selected from conventional data buffers and, in the preferred embodiment, the positions of the first to $N^{th}$ data buffers in the data buffer unit 3 are different from each other. The reason why the different positions of the data buffers can be employed is that a plurality of data buffers included in various circuits of a semiconductor memory device can be used for the data buffer 3. By making the positions of the first to $N^{th}$ data buffers different, bit signals of the data signal din1 are different from each other in transmission distance. Therefore, the first to $N^{th}$ internal data signals din2<1:N> are different from each other in delay section.

Figure 4:
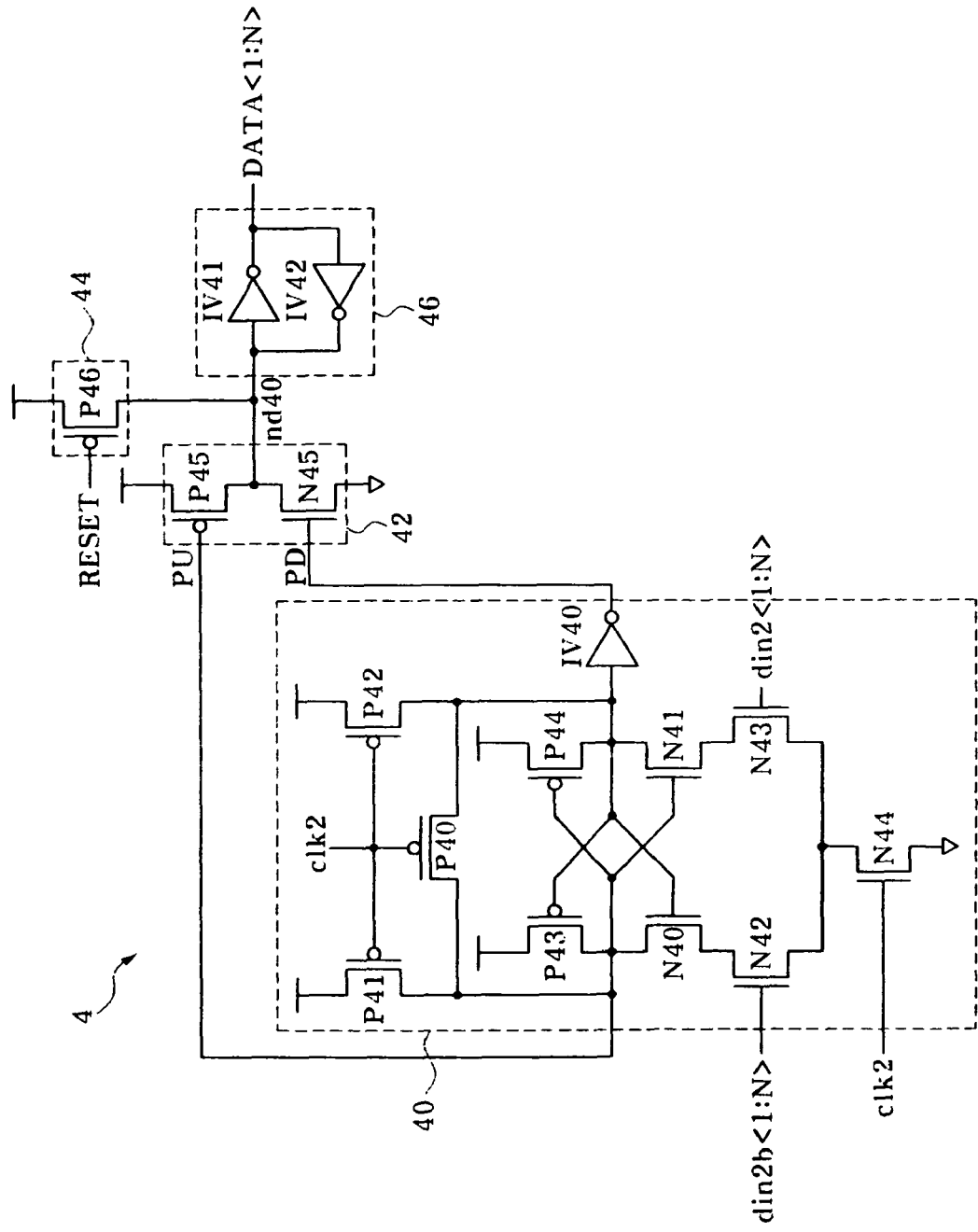
FIG. 4 is a circuit diagram illustrating an embodiment of a configuration of a data latch unit in the apparatus of FIG. 1.

The data latch unit 4 has the first to $N^{th}$ data latch circuits, and in the embodiment of FIG. 4, each of the first to $N^{th}$ data latch circuits includes a driving signal generating unit 40 to produce a pull-up signal PU and a pull-down signal PD by latching one bit signal of the first to $N^{th}$ internal data signals din2<1:N> in response to the second internal clock signal clk2, a driving unit 42 to drive a node nd40 in response to the pull-up signal PU and the pull-down signal PD, a reset unit 44 to pull-up drive the node nd40 in response to a reset signal RESET, and a latch unit 46 to produce sampling data signals DATA<1:N> of N bits by latching a signal on the node nd40. Since the first to $N^{th}$ data latch circuits included in the data latch unit 4 have the same configuration, only one data latch circuit is shown in FIG. 4.

Figure 5:
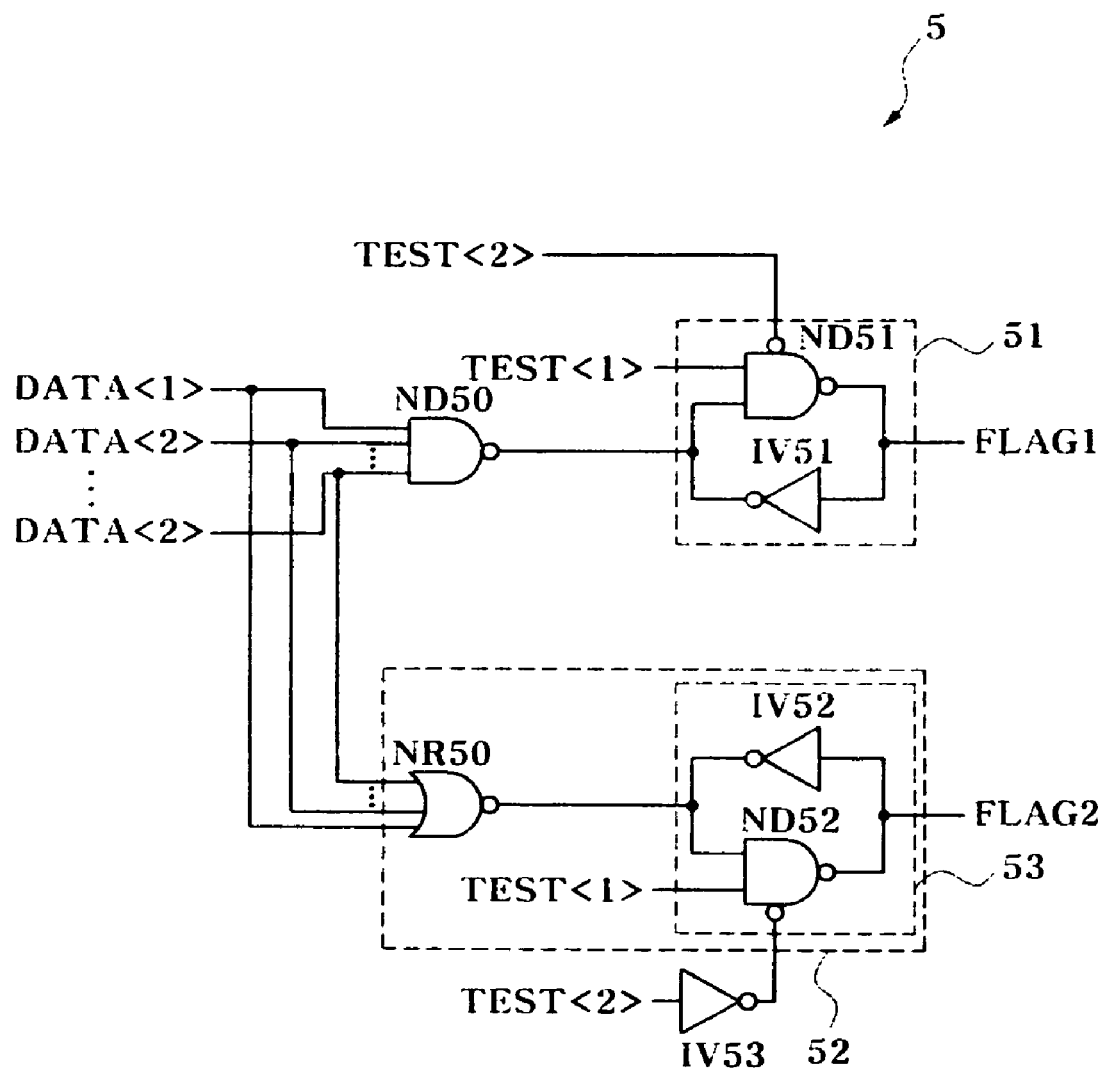
FIG. 5 is a circuit diagram illustrating an embodiment of a configuration of a flag signal generating unit in the apparatus of FIG. 1.

Referring to FIG. 5, an embodiment of configuration of the flag signal generating unit 5 includes a NAND gate ND50 to perform a NAND operation of the N bits of the sampling data signals DATA<1:N>, a latch unit 51 to produce a first flag signal FLAG1 by latching an output signal of the NAND gate ND50 in response to the first and second test signals TEST<1> and TEST<2>, a NOR gate NR50 to perform a NOR operation of the N bits of the sampling data signals DATA<1:N>, and a latch unit 53 to produce a second flag signal FLAG2 by latching an output signal of the NOR gate NR50 in response to the first and second test signals TEST<1> and TEST<2>. Each of the latch units 51 and 53 selectively operates in response to the first and second test signals TEST<1> and TEST<2>. In a state where the first test signal TEST<1> is at a high level, the latch unit 51 operates when the second test signal TEST<2> is at a low level, and the latch unit 53 operates when the second test signal TEST<2> is at a high level.

The counter 6 produces the first to $M^{th}$ count signals COUNT<1:M> in response to the first and second flag signals FLAG1 and FLAG2. In the preferred embodiment, the counter 6 stops counting when the first flag signal FLAG1 is at a high level or the second flag signal FLAG2 is at a low level and performs the counting operation when the first flag signal FLAG1 is at a low level or the second flag signal FLAG2 is at a high level. For embodiment, in a state where the first to $M^{th}$ count signals COUNT<1:M> is '00, . . . , 11', the counter 6 produces the first to $M^{th}$ count signals COUNT<1:M> of '00, . . . , 11' if the first flag signal FLAG1 is input at a low level or the second flag signal FLAG2 is input at high level. That is, the counter 6 increases the first to $M^{th}$ count signals COUNT<1:M> on a bit-by-bit basis.

Figure 6:
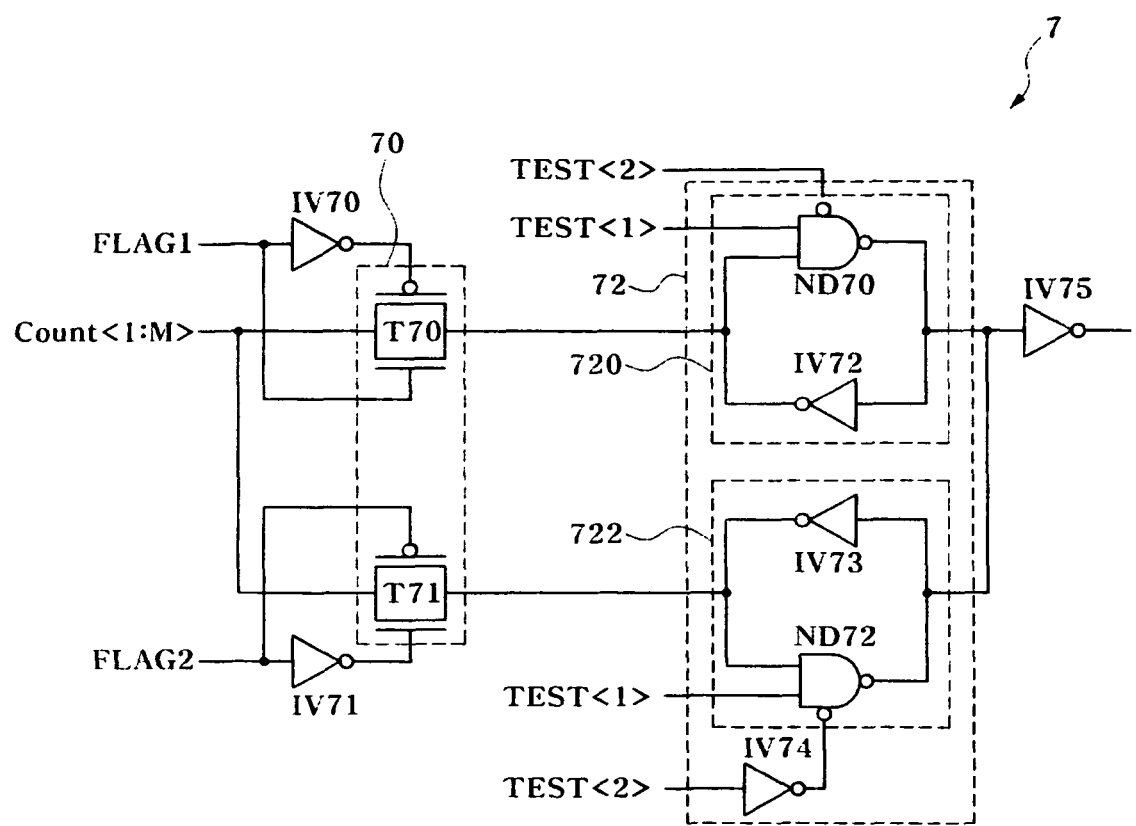
FIG. 6 is a circuit diagram illustrating an embodiment of a configuration of an output unit in the apparatus of FIG. 1.

Referring to FIG. 6, an embodiment of configuration of the output unit 7 includes a transfer unit 70 and a latch unit 72.

The transfer unit 70 includes a plurality of transfer gates. For embodiment, the transfer unit 70 includes a transfer gate T70 to transfer the first to $M^{th}$ count signals COUNT<1:M> in response to the first flag signal FLAG1 and a transfer gate T71 to transfer the first to $M^{th}$ count signals COUNT<1:M> in response to the second flag signal FLAG2. The transfer gate T70 transfers the first to $M^{th}$ count signals COUNT<1:M> when the first flag signal FLAG1 is at a high level and the transfer gate T71 transfers the first to $M^{th}$ count signals COUNT<1:M> when the second flag signal FLAG2 is at a low level.

The latch unit 72 includes a latch circuit 720 to latch an output signal of the transfer gate T70 in response to the first and second test signals TEST<1> and TEST<2> and a latch circuit 722 to latch an output signal of the transfer gate T71 in response to the first and second test signals TEST<1> and TEST<2>. In the latch unit 72, in a state where the first test signal TEST<1> is at a high level, the latch circuit 720 operates when the second test signal TEST<2> is at a low level and the latch circuit 722 operates when the second test signal TEST<2> is at a high level.

Figure 7:
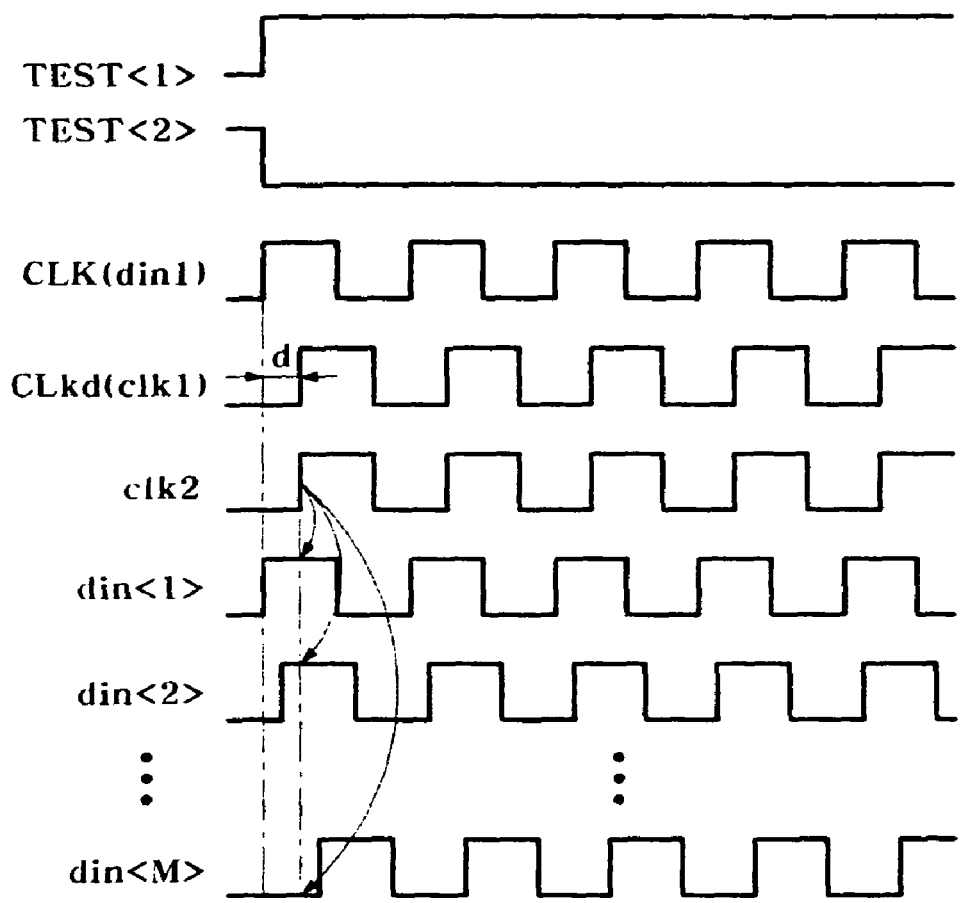
FIGS. 7 and 8 are timing charts illustrating an embodiment of operations of the setup/hole time measuring apparatus of FIG. 1.
Figure 8:
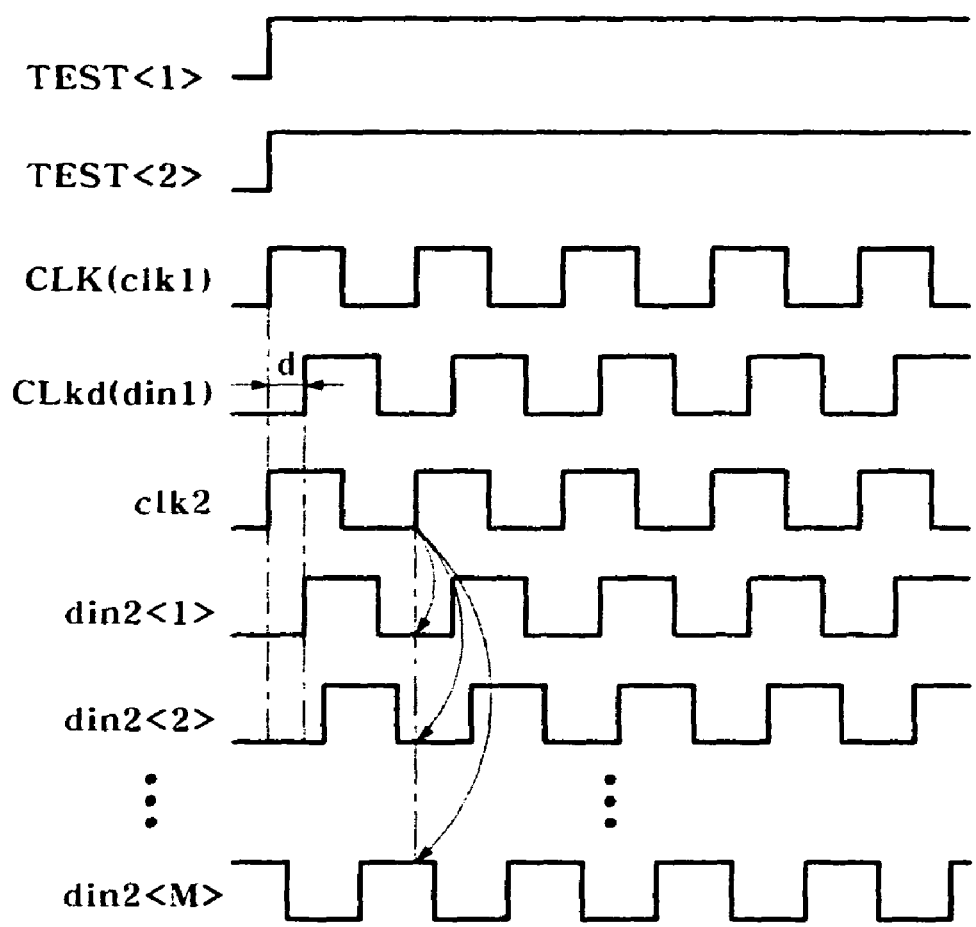

Operation of the setup/hold time measuring apparatus is described below with reference to FIGS. 7 and 8.

Operation of the setup/hold time measuring apparatus is described below with reference to FIG. 7, in a case that the first test signal TEST<1> is at a high level and the second test signal TEST<2> is at a low level.

First, the data generating unit 1 receives the external clock signal CLK and then produces the first internal clock signal clk1 and the data signal din1.

In more detail, the delay unit 10 produces the delayed clock signal CLKd by delaying the external clock signal CLK by a predetermined section. At this time, the delay section of the delay unit 10 having the first to $M^{th}$ delayers can be determined based on the number of delayers which are enabled by the first to $M^{th}$ count signals COUNT<1:M>. For embodiment, when K (K<M) bits of the first to $M^{th}$ count signals COUNT<1:M> are at a high level, K delayers in the delay unit 10 are enabled. Therefore, the delay section of the delay unit 10 is K times as large as the unit delay section (delay time of each of K delayers). In this disclosure, it is assumed that the delay section of the delay unit 10 is set up to be 'd' at an initial state.

The multiplexer 12 selectively transfers the delayed clock signal CLKd generated by the delay unit 10 and the external clock signal CLK in response to the first and second test signal TEST<1> and TEST<2> as the first internal clock signal clk1 and the data signal din1, respectively. As mentioned above, since the first test signal TEST<1> is at a high level and the second test signal TEST<2> is at a low level, the inverters IV11 and IV14 are tuned on. Accordingly, the external clock signal CLK is outputted as the data signal din1 and the delayed clock signal CLKd is outputted as the first internal clock signal clk1.

Next, the clock buffer 2 produces the second internal clock signal clk2 by buffering the first internal clock signal clk1. Further, the first to $N^{th}$ data buffers 3 receive the data signal din1 and then produce the first to $N^{th}$ internal data signal din2<1:N> of N bits, respectively. As shown in FIG. 7, the first to $N^{th}$ internal data signal din2<1:N> can be differently produced according to the position of the first to $N^{th}$ data buffers in the data buffer unit 3. As stated above, this is because the data signal din1 inputted into the first to $N^{th}$ data buffers in the data buffer unit 3 is transmitted under the influence of different delay sections.

The first to $N^{th}$ data latch circuits included in the data latch unit 4 latch the first to $N^{th}$ internal data signal din2<1:N> in synchronization with a rising edge of the second internal clock signal clk2 and then produce first to $N^{th}$ sampling data signals DATA<1:N>. As shown in FIG. 7, the first to $(N-1)^{th}$ internal data signals din2<1:N−1> are at a high level when the second internal clock signal clk2 is at a rising edge, while the first to $(N-1)^{th}$ sampling data signals DATA<1:N−1> are at a high level and the $N^{th}$ sampling data signal DATA<N> is at a low level because the $N^{th}$ internal data signal din2<N> is at a low level.

Next, the flag signal generating unit 5 receives the first to $N^{th}$ sampling data signals DATA<1:N> and then produces the first flag signal FLAG1. That is, the latch unit 51 operates in response to the first test signal TEST<1> of a high level and the second test signal TEST<2> of a low level and the NAND gate ND50 produces the first flag signal FLAG1 of a low level based on the $N^{th}$ sampling data signal DATA<N>.

The counter 6 receives the first flag signal FLAG1 of a low level and produces the first to $M^{th}$ count signals COUNT<1:M>. For embodiment, in a state where the first to $K^{th}$ count signals COUNT<1:K> of the first to $M^{th}$ count signals COUNT<1:M> are at a high level, the counter 6 performs the counting operation when the first flag signal FLAG1 is inputted at a low level so that the first to $(K+1)^{th}$ count signals COUNT<1:K+1> are at a high level. Accordingly, the number of enabled delayers (of the first to $M^{th}$ delayers delay<1:M>) is K+1 such that the delay section is increased in the delay unit 10.

The counting operation of the counter 6 is repeatedly carried out until the first to $N^{th}$ sampling data signals DATA<1:N> are produced at a high level and the first flag signal FLAG1 is then produced at a high level.

If the first flag signal FLAG1 of a high level is produced, the transfer gate T70 in the output unit 7 is turned on and the first to $M^{th}$ count signals COUNT<1:M> are outputted to the pad 8 because the latch circuit 720 operates in response to the first test signal TEST<1> of a high level and the second test signal TEST<2> of a low level. The delay section in the delay unit 10 can be verified through the number of high-level signals of the first to $M^{th}$ count signals COUNT<1:M> and then the setup/hold time can be measured based on these high-level signals.

Operation to measure the setup/hold time is described below, with reference to FIG. 8, in a case that the first test signal TEST<1> is at a high level and the second test signal TEST<2> is at a high level.

First, the data generating unit 1 receives the external clock signal CLK and then produces the first internal clock signal clk1 and the data signal din1.

In more detail, the delay unit 10 produces the delayed clock signal CLKd by delaying the external clock signal CLK by a predetermined section. At this time, the delay section of the delay unit 10 having the first to $M^{th}$ delayers can be determined based on the number of delayers which are enabled by the first to $M^{th}$ count signals COUNT<1:M>. For embodiment, when K (K<M) bits of the first to $M^{th}$ count signals COUNT<1:M> are at a high level, K delayers in the delay unit 10 are enabled. Therefore, the delay section of the delay unit 10 is K times as large as the unit delay section (delay time of each of K delayers). In this disclosure, it is assumed that the delay section of the delay unit 10 is set up to be 'd' at an initial state.

The multiplexer 12 selectively transfers the delayed clock signal CLKd generated by the delay unit 10 and the external clock signal CLK in response to the first and second test signal TEST<1> and TEST<2> as the first internal clock signal clk1 and the data signal din1, respectively. As mentioned above, since the first test signal TEST<1> and the second test signal TEST<2> are at a high level, the inverters IV12 and IV15 are turned on, the external clock signal CLK is output as the first internal clock signal clk1, and the delayed clock signal CLKd is then output as the data signal din1.

The clock buffer 2 produces the second internal clock signal clk2 by buffering the first internal clock signal clk1. Further, the first to $N^{th}$ data buffers 3 receive the data signal din1 and then produce the first to $N^{th}$ internal data signal din2<1:N> of N bits, respectively. As shown in FIG. 8, the first to $N^{th}$ internal data signal din2<1:N> can be differently produced according to the position of the first to $N^{th}$ data buffers in the data buffer unit 3. As stated above, this is because the data signal din1 inputted into the first to $N^{th}$ data buffers in the data buffer unit 3 is transmitted under the influence of different delay sections.

Next, the first to $N^{th}$ data latch circuits included in the data latch unit 4 latch the first to $N^{th}$ internal data signal din2<1:N> in synchronization with a rising edge of the second internal clock signal clk2 and then produces first to $N^{th}$ sampling data signals DATA<1:N>. As shown in FIG. 8, the first to $(N-1)^{th}$ internal data signals din2<1:N-1> are at a high level when the second internal clock signal clk2 is at a rising edge, while the first to $(N-1)^{th}$ sampling data signals DATA<1:N-1> are at a high level and the $N^{th}$ sampling data signal DATA<N> is at a low level because the $N^{th}$ internal data signal din2<N> is at a low level.

The flag signal generating unit 5 receives the first to $N^{th}$ sampling data signals DATA<1:N> and then produces the second flag signal FLAG2. That is, the latch unit 53 operates according to the first test signal TEST<1> of a high level and the second test signal TEST<2> of a high level and the NOR gate NR50 produces the second flag signal FLAG2 of a high level according to the $N^{th}$ sampling data signal DATA<N> of a high level.

The counter 6 receives the second flag signal FLAG2 of a low level and produces the first to $M^{th}$ count signals COUNT<1:M>. For embodiment, in a state where the first to $K^{th}$ count signals COUNT<1:K> of the first to $M^{th}$ count signals COUNT<1:M> are at a high level, the counter 6 performs the counting operation when the second flag signal FLAG2 is inputted at a high level so that the first to $(K+1)^{th}$ count signals COUNT<1:K+1> are at a high level. Accordingly, the number of enabled delayers (of the first to $M^{th}$ delayers delay<1:M>) is K+1 such that the delay section is increased in the delay unit 10.

The counting operation of the counter 6 is repeatedly carried out until the first to $N^{th}$ sampling data signals DATA<1:N> are produced at a low level and the second flag signal FLAG2 is then produced at a low level.

If the second flag signal FLAG2 of a low high level is produced, the transfer gate T71 in the output unit 7 is turned on and the first to $M^{th}$ count signals COUNT<1:M> are outputted to the pad 8 because the latch circuit 720 operates in response to the first test signal TEST<1> of a high level and the second test signal TEST<2> of a high level. The delay section in the delay unit 10 can be verified based on the number of high-level signals of the first to $M^{th}$ count signals COUNT<1:M> and then the setup/hold time can be measured based on these high-level signals.

Although embodiments and embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application 10-2008-0061905, filed on Jun. 27, 2008 the entire contents of which are incorporated herein by reference.

What is claimed is:

1. An apparatus for measuring setup/hold time comprising:
   a data generating unit for delaying an external clock signal according to counting signals and generating an internal clock signal and data signals from the delayed external clock signal in response to test signals;
   a data latch unit for latching buffered data signals in synchronization with the internal clock signal, wherein the buffered data signals are produced by buffering the data signals;
   a flag signal generating unit for generating flag signals from the latched data signals latched in the data latch unit, in response to the test signals; and
   a counter for producing the counting signals in response to the flag signals.

2. The apparatus of claim 1, wherein the data generating unit includes:
   a delay unit for delaying the external clock signal by a delay section which is determined based on the counting signals; and
   a multiplexer for generating the internal clock signal and the data signals from an output signal of the delay unit and the external clock signal in response to the test signals.

3. The apparatus of claim 2, wherein the delay unit includes a plurality of delayers which are selectively enabled by the counting signals and wherein the delay section of the delay unit is determined based on a number of the delayers which are enabled by the counting signals.

4. The apparatus of claim 2, wherein the multiplexer includes:
   a first transfer unit for selectively transferring the external clock signal or the output signal of the delay unit as the internal clock signal in response to the test signals; and
   a second transfer unit for selectively transferring the external clock signal or the output signal of the delay unit as the data signals in response to the test signals.

5. The apparatus of claim 1, wherein the data latch unit includes:
   a driving signal generating unit for generating a driving signal by latching the buffered data signals in response to a buffered signal which is produced by buffering the internal clock signal; and
   a driving unit for driving an output node in response to the driving signal.

6. The apparatus of claim 5, wherein the data latch unit further includes:
   a latch circuit for latching a signal from the output node; and
   a reset circuit for setting up a voltage level of the output node in response to a reset signal.

7. The apparatus of claim 1, wherein the flag signal generating unit produces the flag signals in response to the test signals, wherein the flag signals are enabled when the latched data signals in the data latch unit are at a predetermined voltage level.

8. The apparatus of claim 1, further comprising an output unit for outputting the counting signals to a pad in response to the flag signals and the test signals.

9. The apparatus of claim 8, wherein the output unit includes:
   a transfer unit for transferring the counting signals in response to the flag signals; and
   a latch unit for latching an output signal of the transfer unit in response to the test signals.

10. An apparatus for measuring setup/hold time comprising:

a delay unit for delaying an external clock signal by a predetermined delay section, wherein the delay unit includes a plurality of delayers which are selectively enabled in response to a plurality of counting signals;

a multiplexer for generating an internal clock signal and a data signal by selectively transferring the external clock signal or an output signal of the delay unit in response to test signals;

a plurality of buffers for generating a plurality of internal data signals by buffering the data signal;

a data latch unit for latching the plurality of internal data signals in synchronization with the internal clock signal and then extracting a plurality of sampling data signals;

a flag signal generating unit for generating first and second flag signals using the plurality of sampling data signals in response to the test signals; and a counter for producing the plurality of counting signals in response to the first and second flag signals.

11. The apparatus of claim 10, wherein a delay section of the delay unit is determined based on a number of the delayers which are enabled.

12. The apparatus of claim 10, wherein the multiplexer includes:
a first transfer unit for selectively transferring the external clock signal or the output signal of the delay unit as the internal clock signal in response to the test signals; and
a second transfer unit for selectively transferring the external clock signal or the output signal of the delay unit as the data signal in response to the test signals.

13. The apparatus of claim 10, wherein the plurality of buffers includes;
a first buffer for generating a first internal data signal by buffering the data signal; and
a second buffer for generating a second internal data signal by buffering the data signal.

14. The apparatus of claim 13, wherein the data latch unit includes:
a first data latch unit for latching the first internal data signal in response to a buffered signal and then producing a first sampling data signal; and
a second data latch unit for latching the second internal data signal in response to the buffered signal, which is produced by buffering the internal clock signal, and then producing a second sampling data signal.

15. The apparatus of claim 14, wherein the first data latch unit includes:
a driving signal generating unit for generating a driving signal by latching the first internal data signal in response to the buffered signal which is produced by buffering the internal clock signal; and a driving unit for driving an output node in response to the driving signal.

16. The apparatus of claim 14, wherein the second data latch unit includes:
a driving signal generating unit for generating a driving signal by latching the second internal data signal in response to the buffered signal which is produced by buffering the internal clock signal; and
a driving unit for driving an output node in response to the driving signal.

17. The apparatus of claim 14, wherein the flag signal generating unit produces the first and second flag signals in response to the test signals, wherein the first and second flag signals are enabled when the first and second sampling data signals are at a predetermined voltage level.

18. The apparatus of claim 14, wherein the flag signal generating unit includes:
a first logic circuit for performing a logic operation of the first and second sampling data signals;
a first latch unit for latching an output signal of the first logic circuit in response to the test signals and then transferring the latched signal as the first flag signal;
a second logic circuit for performing a logic operation of the first and second sampling data signals; and
a second latch unit for latching an output signal of the second logic circuit in response to the test signals and then transferring the latched signal as the second flag signal.

19. The apparatus of claim 18, wherein the first logic circuit performs a NAND operation and wherein the second logic circuit performs a NOR operation.

20. The apparatus of claim 18, wherein the first and second latch units are selectively operated in response to the test signals.

21. The apparatus of claim 10, further comprising an output unit for outputting the counting signals to a pad in response to the first and second flag signals and the test signals.

22. The apparatus of claim 21, wherein the output unit includes:
a first transfer gate for transferring the counting signals in response to the first flag signal;
a second transfer gate for transferring the counting signals in response to the second flag signal;
a first latch circuit for latching an output signal of the first transfer gate in response to the test signals; and
a second latch circuit for latching an output signal of the second transfer gate in response to the test signals.

23. The apparatus of claim 22, wherein the first and second latch circuits are selectively operate in response to the test signals.

* * * * *